(12) United States Patent
Stadter

(10) Patent No.: US 11,881,845 B2
(45) Date of Patent: Jan. 23, 2024

(54) PROTECTIVE CIRCUIT FOR A SEMICONDUCTOR SWITCH

(71) Applicant: Siemens Aktiengesellschaft, Munich (DE)

(72) Inventor: Norbert Stadter, Buttenheim (DE)

(73) Assignee: Siemens Aktiengesellschaft, Munich (DE)

( * ) Notice: Subject to any disclaimer, the term of this patent is extended or adjusted under 35 U.S.C. 154(b) by 101 days.

(21) Appl. No.: 17/440,361

(22) PCT Filed: Feb. 21, 2020

(86) PCT No.: PCT/EP2020/054657
§ 371 (c)(1),
(2) Date: Sep. 17, 2021

(87) PCT Pub. No.: WO2020/187527
PCT Pub. Date: Sep. 24, 2020

(65) Prior Publication Data
US 2022/0200592 A1 Jun. 23, 2022

(30) Foreign Application Priority Data
Mar. 18, 2019 (EP) .................... 19163389

(51) Int. Cl.
*H03K 17/0812* (2006.01)
*H03K 17/567* (2006.01)

(52) U.S. Cl.
CPC . *H03K 17/08128* (2013.01); *H03K 17/08122* (2013.01); *H03K 17/08126* (2013.01); *H03K 17/567* (2013.01)

(58) Field of Classification Search
CPC ....... H03K 17/08128; H03K 17/08122; H03K 17/08126; H03K 17/567; H03K 17/602
See application file for complete search history.

(56) References Cited

U.S. PATENT DOCUMENTS

| 5,285,346 A | 2/1994 | Davies et al. |
| 2005/0057866 A1 | 3/2005 | Armer et al. |
| 2017/0034887 A1* | 2/2017 | Ichikawa ................. B60Q 1/04 |

FOREIGN PATENT DOCUMENTS

| CN | 203434951 U | * | 2/2014 |
| DE | 3723786 A1 | * | 7/1987 |
| DE | 3723788 A1 | | 1/1989 |
| EP | 1182776 A2 | | 2/2002 |
| JP | S63208317 A | | 8/1988 |

* cited by examiner

*Primary Examiner* — Metasebia T Retebo
(74) *Attorney, Agent, or Firm* — Henry M. Feiereisen LLC

(57) ABSTRACT

A protective circuit for a semiconductor switch includes a clamp diode, an NPN bipolar transistor, a PNP bipolar transistor, a capacitor connected in parallel with the base-emitter path of the PNP bipolar transistor, and at least three resistors. The bipolar transistors are connected to a thyristor structure that is connected to the cathode of the clamp diode. A first resistor is connected in parallel with the base-emitter path of the NPN bipolar transistor. A first terminal of the second resistor is connected to the base of the PNP bipolar transistor. Either a third resistor is connected in parallel with the base-emitter path of the PNP bipolar transistor, or a first terminal of the third resistor is connected to the emitter of the PNP bipolar transistor and the second terminal of the third resistor is connected to the second terminal of the second resistor.

15 Claims, 10 Drawing Sheets

PROTECTIVE CIRCUIT FOR A SEMICONDUCTOR SWITCH

CROSS-REFERENCES TO RELATED APPLICATIONS

This application is the U.S. National Stage of International Application No. PCT/EP2020/054657, filed Feb. 21, 2020, which designated the United States and has been published as International Publication No. WO 2020/187527 A1 and which claims the priority of European Patent Application, Serial No. 19163389.0, filed Mar. 18, 2019, pursuant to 35 U.S.C. 119(a)-(d).

BACKGROUND OF THE INVENTION

The Invention relates to a protective circuit for a semiconductor switch with a gate controllable by a gate driver and a circuit arrangement with a protective circuit of this type.

By the gate of a semiconductor switch is meant the control terminal of the semiconductor switch. The primary purpose of the invention is the protection of a voltage-controlled semiconductor switch, for example of a bipolar transistor with an insulated gate electrode (IGBT) or of a metal-oxide semiconductor field-effect transistor (MOSFET), which is controlled by way of a gate voltage or a gate potential applied to the gate. If the power loss is too great, for example in the case of a short-circuit, the semiconductor switch may be damaged or destroyed. To prevent such damage it must be ensured that, for example in the event of a short-circuit, the gate voltage does not rise significantly above its specified switch-on value (compliance with the "safe operating area"). Otherwise the rise in the gate voltage can result in an excessively high current through the semiconductor switch, for example an excessively high collector current in the case of an IGBT or a drain current in the case of a MOSFET, and the power loss can increase too sharply.

To stop the power loss from being excessive, a voltage can for example be detected and monitored at a load terminal of the semiconductor switch, for example the collector voltage in the case of an IGBT or the drain voltage in the case of a MOSFET, by means of a high-voltage diode or an operational power amplifier. Alternatively a current through the semiconductor switch can be detected and monitored, for example with a shunt or a current transformer. However, these methods do not always permit a sufficiently rapid switch-off of the semiconductor switch, since potential wells have to be overtraveled, are complex and costly and/or require a great deal of space because of air gaps and creepage distances.

DE 37 23 786 A1 discloses an arrangement for the automatic overcurrent disconnection of insulated-gate or field-effect transistors, in which a thyristor with an anode-side connection to the gate feedline or the series circuit, emulating a thyristor in its switching function, of two transistors with collector connection of the first transistor is connected to the gate feedline between the gate feedlines and emitter feedlines of the insulated-gate or field-effect transistor. A Zener diode with a cathode-side connection is connected to the gate feedline between the gate feedline and the control electrode of the thyristor or, respectively, the base of the second transistor of the transistor series circuit, and a diode with a cathode-side connection to the gate is connected in the gate feedline or, respectively, a feedline for applying a positive gate-emitter voltage.

The object of the invention is to specify an improved protective circuit for a semiconductor switch with a gate controllable by a gate driver and a circuit arrangement with a protective circuit of this type.

SUMMARY OF THE INVENTION

The object is achieved according to the invention by a protective circuit as set forth hereinafter, and by a circuit arrangement as set forth hereinafter.

Advantageous embodiments of the invention are the subject matter of the subclaims.

An inventive protective circuit for a semiconductor switch with a gate controllable by a gate driver is connected to the gate, connected in parallel with the gate driver. The protective circuit comprises a clamp diode, an NPN bipolar transistor, a PNP bipolar transistor, a capacitor and (at least) three resistors. The collector of the NPN bipolar transistor is connected to the base of the PNP bipolar transistor. The base of the NPN bipolar transistor is connected to the collector of the PNP bipolar transistor. The emitter of the PNP bipolar transistor is connected to the cathode of the clamp diode. A first resistor is connected in parallel with the base emitter path of the NPN bipolar transistor. A first terminal of a second resistor is connected to the base of the PNP bipolar transistor. The capacitor is connected in parallel with the base emitter path of the PNP bipolar transistor. A third resistor is connected either in parallel with the base emitter path of the PNP bipolar transistor, or a first terminal of the third resistor is connected to the emitter of the PNP bipolar transistor and the second terminal of the third resistor is connected to the second terminal of the second resistor.

An inventive protective circuit serves to protect a semiconductor switch against excessively high power losses. Key components of the protective circuit are two bipolar transistors interconnected to form a thyristor structure and a clamp diode, the cathode of which is connected to said thyristor structure. The protective circuit is connected to the gate of the semiconductor switch via the clamp diode in parallel with a gate driver. This enables the thyristor structure to be fired via the clamp diode if the gate voltage of the semiconductor switch rises too sharply and a desaturation of the semiconductor switch is imminent. By firing the thyristor structure the semiconductor switch can be temporarily or permanently switched off or the gate voltage and a short-circuit current through the semiconductor switch can be reduced. The invention brings about a simple protective circuit with very low-cost components (two bipolar transistors, resistors, a clamp diode, a capacitor and possibly further simple components), which require only a small amount of space. The protective circuit thus in particular enables low-cost protection of the semiconductor switch without complex access to the collector voltage or the collector current.

One embodiment of the protective circuit provides for a fourth resistor which is connected to the anode of the clamp diode. This embodiment of the protective circuit permits a reduction in the gate voltage and of a short-circuit current flowing through the semiconductor switch, in that a fourth resistor is connected between the anode of the damp diode and the gate of the semiconductor switch. The reduction in the short-circuit current enables a semiconductor switch with a low saturation voltage to be used, in which a short-circuit time cannot be controlled without a reduction in the short-circuit current. Thanks to the reduction of the short-circuit current the semiconductor switch can withstand a short-circuit for longer without damage, such that during this period a different monitoring circuit can initiate the switch-off of the semiconductor switch.

A further embodiment of the protective circuit provides for an additional diode, the cathode of which is connected to the emitter of the PNP bipolar transistor and the cathode of the clamp diode either directly or via a fifth resistor. With this embodiment of the protective circuit the load on a gate driver controlling the gate can be reduced, in that a driver voltage of the gate driver is applied to the anode of the additional diode.

In a further embodiment of the protective circuit the clamp diode is a Schottky diode, A Schottky diode is suitable as a damp diode for the protective circuit in particular thanks to its low switching times.

An inventive circuit arrangement comprises a semiconductor switch with a gate, a gate driver for controlling the gate and an inventive protective circuit which is connected to the gate, connected in parallel with the gate driver. The gate driver has an electronic switching unit which can be controlled by a driver voltage of the gate driver and with which the gate is connected to a switch-on potential for switching on the semiconductor switch via a switch-on gate resistor and for switching off the semiconductor switch via a switch-off gate resistor. The advantages of the inventive circuit arrangement emerge from the above-mentioned advantages of an inventive protective circuit.

In one embodiment of the circuit arrangement the emitter of the NPN bipolar transistor is connected to the switch-off potential and the second terminal of the second resistor is connected to the switch-on potential. In this way the protective circuit is connected in parallel with the components of the gate driver between the switch-on potential and the switch-off potential.

In a further embodiment of the circuit arrangement the anode of the clamp diode is connected to the gate directly or via a fourth resistor. As already explained above, thanks to the fourth resistor the short-circuit current through the semiconductor switch can be reduced particularly advantageously.

A further embodiment of the circuit arrangement provides for an additional diode, the cathode of which is connected directly or via a fifth resistor to the emitter of the PNP bipolar transistor and the cathode of the clamp diode and at the anode of which the driver voltage is present. As already explained above, the load on the gate driver can be reduced thanks to the additional diode.

In a further embodiment of the circuit arrangement the switch-on gate resistor and the switch-off gate resistor are identical. As a result, the number of components hi the circuit arrangement can be reduced, in that the same gate resistor is used to switch the semiconductor switch on and off.

In a further embodiment of the circuit arrangement a ballast diode is connected between the switch-on gate resistor and the gate driver, the cathode of which is connected to the switch-on gate resistor.

In further embodiments of the circuit arrangement the semiconductor switch is a bipolar transistor with an insulated gate electrode (IGBT) or a metal-oxide semiconductor field-effect transistor (MOSFET). These embodiments of the circuit arrangement take into account the fact that both an IGBT and a MOSFET can advantageously be protected by an inventive protective circuit.

In further embodiments of the circuit arrangement the electronic switching unit of the gate driver has a push-pull power amplifier with power amplifier bipolar transistors or a power amplifier with complementary power amplifier metal-oxide semiconductor field-effect transistors. These embodiments of the circuit arrangement take into account the fact that an inventive protective circuit can be used in conjunction with both types of gate drivers mentioned.

BRIEF DESCRIPTION OF THE DRAWING

The properties, features and advantages of this invention described above and the manner in which they are achieved become clear and more readily understandable in connection with the following description of exemplary embodiments, which are explained in greater detail in connection with the drawings, in which.

DETAILED DESCRIPTION OF PREFERRED EMBODIMENTS

Figure 1:
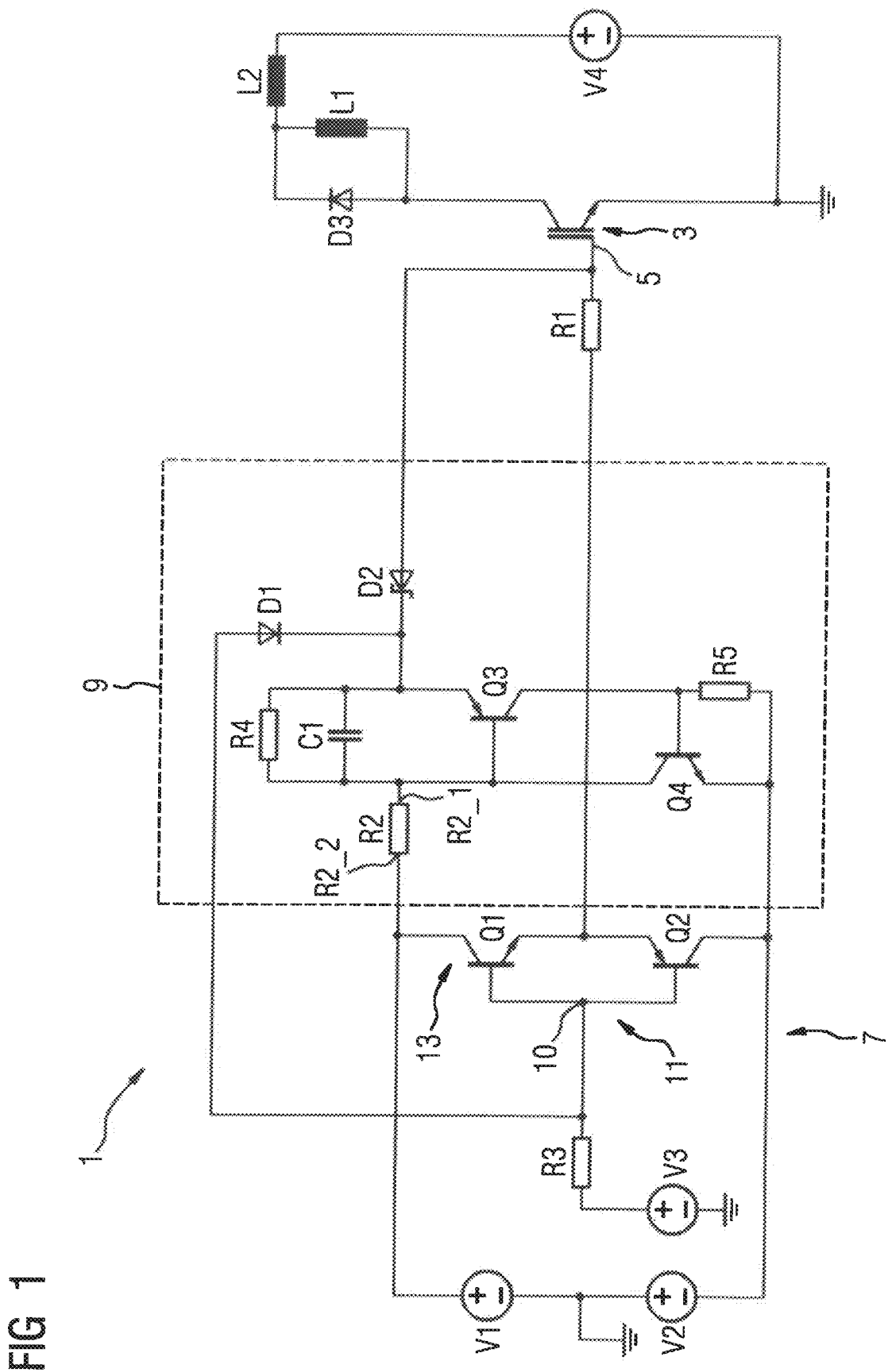
FIG. 1 shows a first exemplary embodiment of an inventive circuit arrangement.

Parts corresponding to one another are provided with the same reference characters in the figures.

FIG. 1 shows a first exemplary embodiment of an inventive circuit arrangement 1. The circuit arrangement 1 comprises a semiconductor switch 3 with a gate 5, a gate driver 7 to control the gate 5 and a first exemplary embodiment of an inventive protective circuit 9. The semiconductor switch 3 of this exemplary embodiment is an IGBT.

The gate driver 7 has an electronic switching unit 11, which is connected to the gate 5 via a gate resistor R1. The gate resistor R1 serves as a switch-on gate resistor during switch-on of the semiconductor switch 3 and as a switch-off gate resistor during switch-off of the semiconductor switch 3.

With the electronic switching unit 11 the gate 5 is connected to a switch-on potential via the gate resistor R1 for switch-on of the semiconductor switch 3 and to a switch-off potential for switch-off of the semiconductor switch. The switch-on potential is generated by a switch-on voltage source V1. The switch-off potential is generated by a switch-off voltage source V2. The electronic switching unit 11 is controlled by a driver voltage. The driver voltage is applied to a control input 10 of the electronic switching unit 11 via a driver resistor R3 by a driver voltage source V3. The voltage sources V1, V2, V3 are each DC voltage sources.

The protective circuit 9 comprises a clamp diode D2, a PNP bipolar transistor Q3, an NPN bipolar transistor Q4, a capacitor C1, a first resistor R5, a second resistor R2, a third resistor R4 and an additional diode D1.

The collector of the NPN bipolar transistor Q4 is connected to the base of the PNP bipolar transistor Q3. The base of the NPN bipolar transistor Q4 is connected to the collector of the PNP bipolar transistor Q3. Thus the PNP bipolar transistor Q3 and the NPN bipolar transistor Q4 are interconnected to form a thyristor structure.

The first resistor R5 is connected in parallel with the base emitter path of the NPN bipolar transistor Q4. A first terminal R2_1 of the second resistor R2 is connected to the base of the PNP bipolar transistor Q3. The second terminal R2_2 of the second resistor R2 is connected to the switch-on potential, i.e. to the positive terminal of the switch-on voltage source V1. The capacitor C1 and the third resistor R4 are connected in parallel with the base emitter path of the PNP bipolar transistor Q3.

The cathode of the clamp diode D2 is connected to the emitter of the PNP bipolar transistor Q3. The anode of the damp diode D2 is connected to the gate 5 of the semiconductor switch 3. The cathode of the additional diode D1 is connected to the emitter of the PNP bipolar transistor Q3 and the cathode of the damp diode D2. The driver voltage is present at the anode of the additional diode D1, i.e. the anode of the additional diode D1 is connected to the control input 10 of the electronic switching unit 11. The protective circuit 9 is connected in parallel with the gate driver 7 between the control input 10 of the gate driver 7 and the gate 5.

In the exemplary embodiment shown in FIG. 1 the electronic switching unit 11 has a push-pull power amplifier 13 with power amplifier bipolar transistors Q1, Q2. The clamp diode D2 is a Schottky diode. The gate resistor R1 has for example a resistance value of 10Ω. The driver resistor R3 has for example a resistance value of 470Ω. The first resistor R5 has for example a resistance value of 200Ω. The second resistor R2 has for example a resistance value of 1 kΩ. The third resistor R4 has for example a resistance value of 10 kΩ. The capacitor C1 has for example a capacitance of 1 nF.

Figure 2:
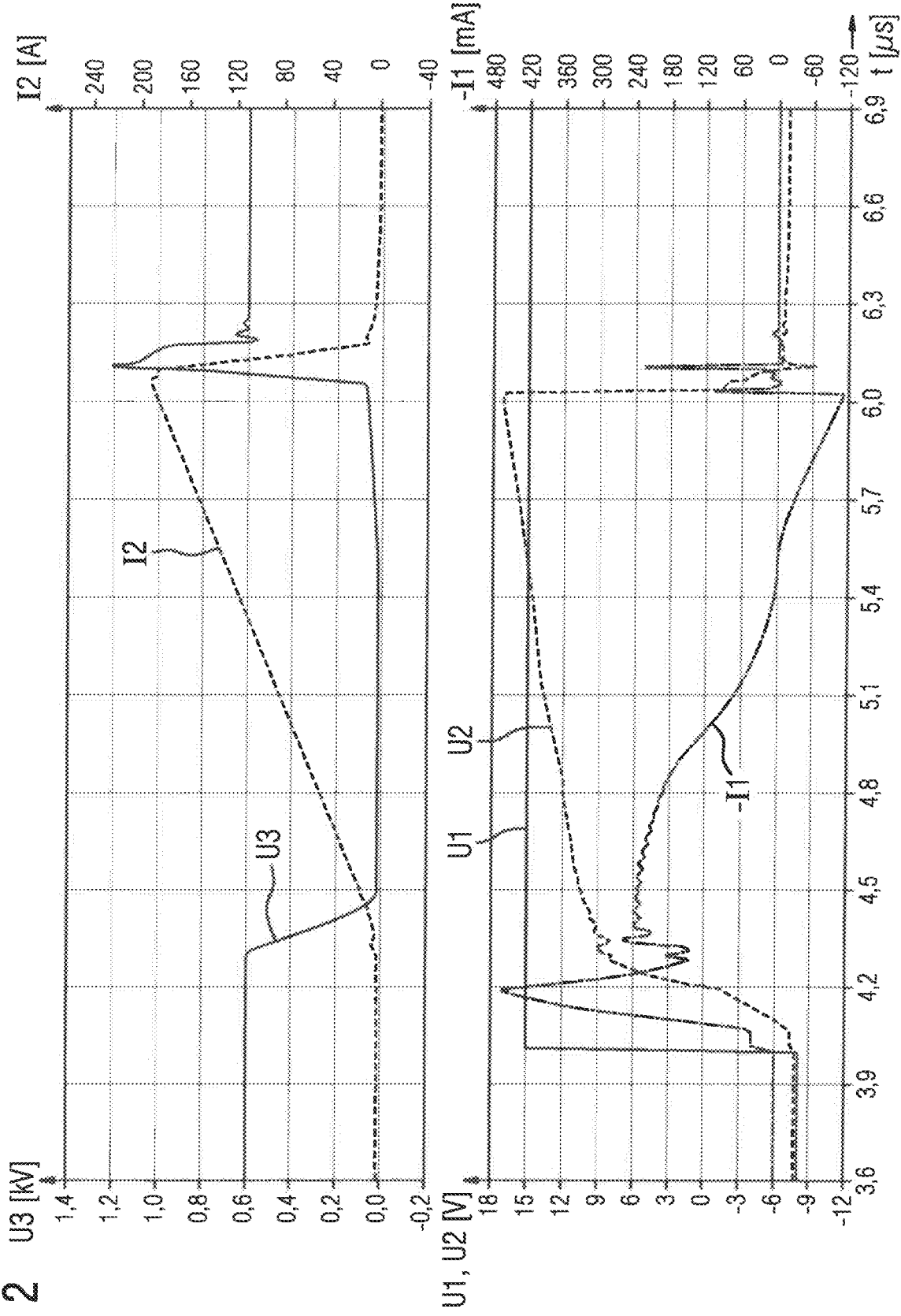
FIG. 2 shows progressions over time of currents and voltages of the circuit arrangement shown in FIG. 1, if the semiconductor switch reaches its desaturation limit after switch-on, FIG. 3 shows progressions over time of currents and voltages of the circuit arrangement shown in FIG. 1, if the semiconductor switch reaches its desaturation limit after a second switch-on, FIG. 4 shows a second exemplary embodiment of an inventive circuit arrangement.

FIG. 2 shows progressions of currents I1, I2 and voltages U1, U2, U3 of the circuit arrangement 1 shown in FIG. 1 as a function of a time t, if the semiconductor switch 3 reaches its desaturation limit after the switch-on. The progressions have been generated with a simulation, in which the semiconductor switch 3 is interconnected, as shown in FIG. 1, to a half-bridge diode D3 and a leakage inductance L2 to form a half-bridge and a load connected to the half-bridge has been simulated using a load inductance L1 and a load voltage source V4. The load voltage source V4 is a DC voltage source. The anode of the half-bridge diode D3 is connected to the collector of the semiconductor switch 3, the load inductance L1 is connected in parallel with the half-bridge diode D3, the leakage inductance L2 is connected between the parallel circuit of the half-bridge diode D3 and the bad inductance L1 and the positive terminal of the bad voltage source V4, and the negative terminal of the bad voltage source V4 is connected to the emitter of the semiconductor switch 3. The emitter of the semiconductor switch 3 is connected to the negative terminals of the voltage sources V1 and V3 and the positive terminal of the voltage source V2, i.e. lies on the same ground potential as these terminals. The voltages U1, U2, U3 are each related to the ground potential, wherein U1 is the driver signal of the gate driver 7, i.e. the voltage generated by the driver voltage source V3 compared to the ground potential, U2 is the gate voltage present at the gate 5 compared to the ground potential and U3 is the collector voltage present at the collector of the semiconductor switch 3 compared to the ground potential.

The simulation has been carried out for a gate resistance R1 of 10Ω, a driver resistance R3 of 470Ω, a first resistance R5 of 200Ω, a second resistance R2 of 1 kΩ, a third resistance R4 of 10 kΩ, a capacitor C1 with the capacitance 1 nF, a bad inductance L1 of 5 μH and a leakage inductance L2 of 200 nH.

Approximately 4 μs after the start of the simulation a driver signal U1 of the gate driver 7 is increased from a switch-off value of −8 V to a switch-on value of 15 V for the switch-on of the semiconductor switch 3. In consequence, a gate voltage U2 present at the gate 5 increases from a switch-off gate voltage value which approximately corresponds to the switch-off value of the driver signal U1, and a reaction current I1 flowing through the gate resistor R1 is formed, and is represented with an inverted sign in FIG. 2. As the gate voltage U2 increases, a collector voltage U3 of 0.6 kV present at the collector of the semiconductor switch 3 drops to virtually 0 V and a collector current I2 flowing between the collector and the emitter of the semiconductor switch 3 is formed, which increases linearly because of the load inductance L1.

The reaction current I1 initially increases in amount after the change in the driver signal U1 and then drops again as the gate voltage U2 increases. Approximately 5.5 μs after the start of the simulation the reaction current I1 changes its direction (or its sign), since the Miller capacitance of the semiconductor switch 3 charges up and the reaction current I1 flows back into the gate 5. As the collector current I2 increases the semiconductor switch 3 reaches its desaturation limit approximately 5.8 μs after the start of the simulation and the collector voltage U3 again starts to increase (slowly at first). Because of the Miller capacitance of the semiconductor switch 3 the gate voltage U2 rises above the switch-on value of 15 V of the driver signal U1 and the amount of the reaction current I1 flowing back into the gate 5 increases. Somewhat later than 6 μs after the start of the simulation the thyristor structure formed by the PNP bipolar transistor Q3 and the NPN bipolar transistor Q4 is finally fired via the clamp diode D2, as a result of which the gate voltage U2 approaches the switch-off gate voltage value, the reaction current I1 and the collector current I2 again drop to zero, the collector voltage U3 assumes its initial value of 0.6 kV and the semiconductor switch 3 is switched off.

Figure 3:
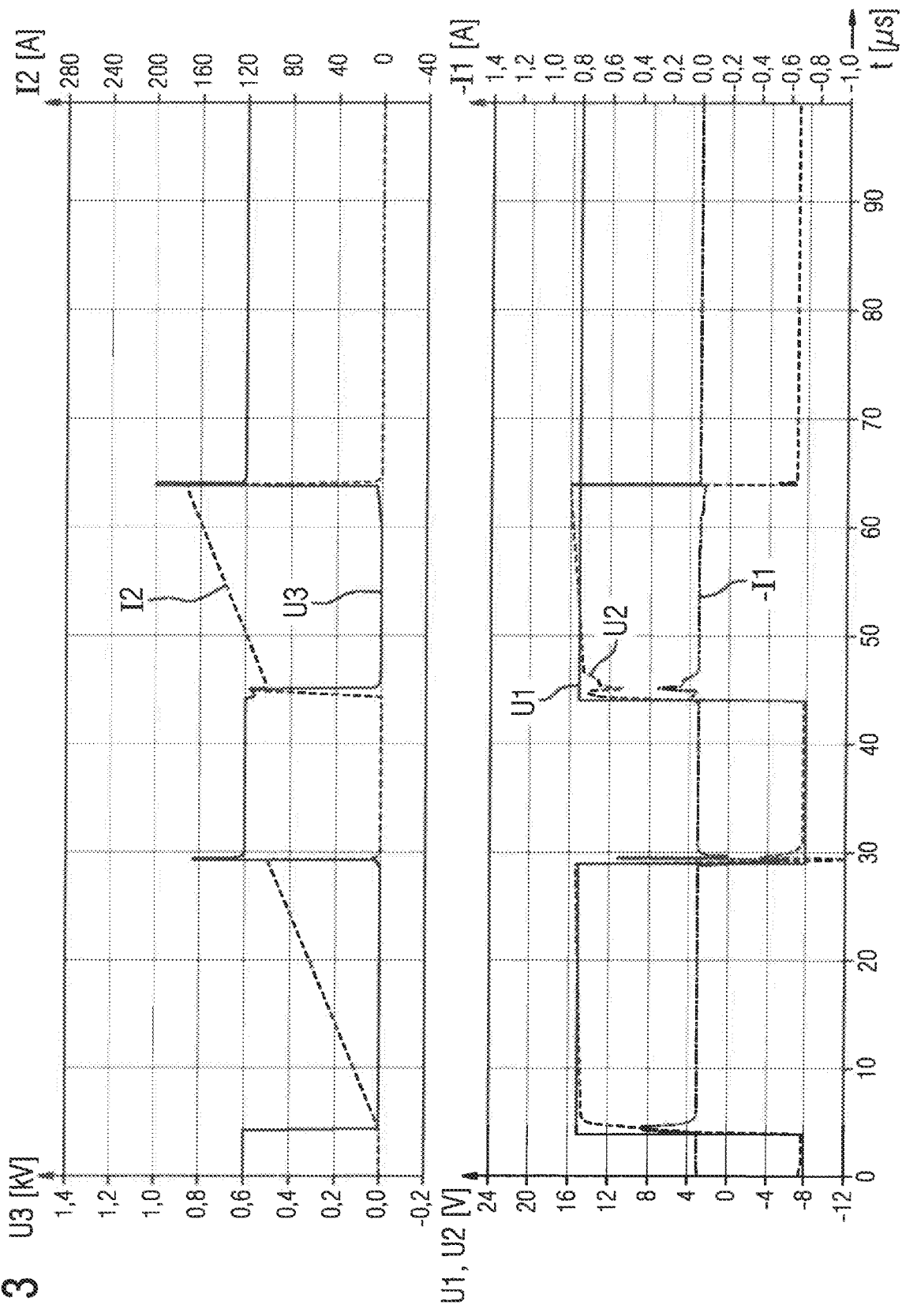

Analogously to FIG. 2, FIG. 3 shows progressions over time of the currents I1, I2 and voltages U1, U2, U3 of the circuit arrangement 1 shown in FIG. 1, if the semiconductor switch 3 reaches its desaturation limit after a second switch-on. The progressions have been generated with a simulation, in which unlike the simulation shown in FIG. 2 the load inductance L1 has the inductance value of 150 μH. Apart from this, the simulation is based on the same parameters as the simulation shown in FIG. 2.

The semiconductor switch 3 is switched on approximately 4 μs after the start of the simulation, in that the driver signal U1 of the gate driver 7 is increased from the switch-off value of −8 V to the switch-on value of 15 V, and is switched off again approximately 29 μs after the start of the simulation, in that the driver signal U1 is again reduced to the switch-off value of −8 V. During this first switch-on phase the gate voltage U2 rises only insignificantly above the switch-on value of 15 V, such that the thyristor structure formed by the PNP bipolar transistor Q3 and the NPN bipolar transistor Q4 is not fired.

Approximately 44 μs after the start of the simulation the semiconductor switch 3 is switched on a second time. In this second switch-on phase the collector current I2 rises rapidly after the switch-on to approximately the same value as at the end of the first switch-on phase, and the gate voltage U2 rises more significantly above the switch-on value of 15 V than in the first switch-on phase, as a result of which the reaction current I1 flows back into the gate 5, the thyristor structure formed by the PNP bipolar transistor Q3 and the NPN bipolar transistor Q4 fires after approximately 64 μs and the semiconductor switch 3 is switched off.

FIGS. 2 and 3 show that the protective circuit 9 shown in FIG. 1 brings about a switch-off of the semiconductor switch 3 by firing the thyristor structure formed by the PNP bipolar transistor Q3 and the NPN bipolar transistor Q4, if the driver signal U1 lies at the switch-on value of 15 V until the semiconductor switch 3 reaches its desaturation limit.

Figure 4:
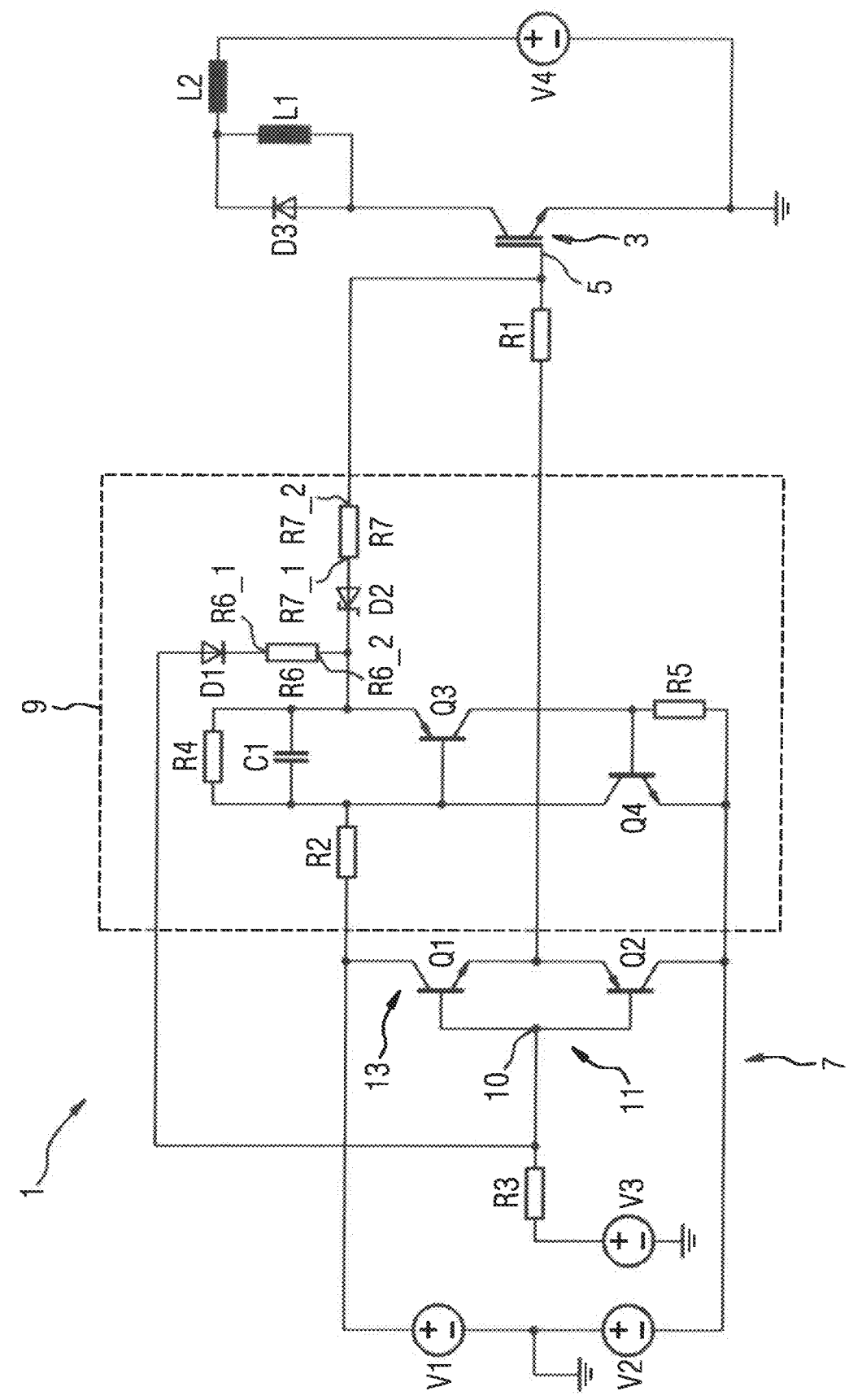

FIG. 4 shows a second exemplary embodiment of an inventive circuit arrangement 1. The circuit arrangement 1 differs from the circuit arrangement 1 shown in FIG. 1 only in that the protective circuit 9 has a fourth resistor R7 and a fifth resistor R6 in addition to the components of the protective circuit 9 shown in FIG. 1. A first terminal R7_1 of the fourth resistor R7 is connected to the anode of the clamp diode D2. The second terminal R7_2 of the fourth resistor R7 is connected to the gate 5 and the gate-side terminal of the gate-resistor R1. A first terminal R6_1 of the fifth resistor R6 is connected to the cathode of the additional diode D1. The second terminal R6_2 of the fifth resistor R6 is connected to the emitter of the PNP bipolar transistor Q3 and the cathode of the clamp diode D2.

Figure 5:
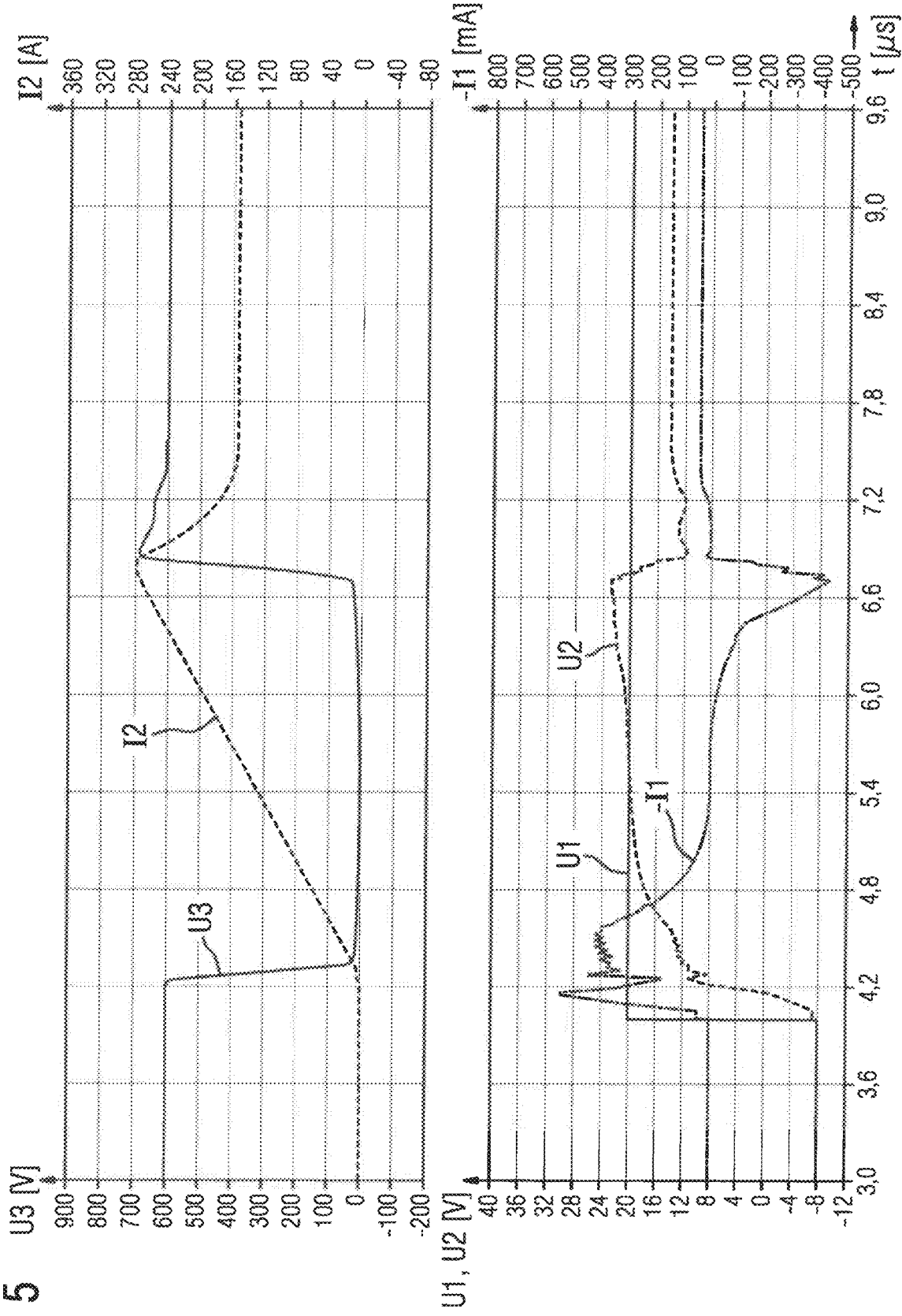
FIG. 5 shows progressions over time of currents and voltages of the circuit arrangement shown in FIG. 4, if the semiconductor switch reaches its desaturation limit after the switch-on, FIG. 6 shows progressions over time of currents and voltages of the circuit arrangement shown in FIG. 4, if the semiconductor switch reaches its desaturation limit after a second switch-on, FIG. 7 shows a third exemplary embodiment of an inventive circuit arrangement.

FIG. 5 shows progressions over time of the currents I1, I2 and voltages U1, U2, U3 of the circuit arrangement 1 shown in FIG. 4 during a simulation, which is analogous to the simulation shown in FIG. 2. As in the simulation shown in FIG. 2, the simulation shown in FIG. 5 has been carried out for a gate resistance R1 of 10Ω, a driver resistance R3 of 470Ω, a second resistance R2 of 1 kΩ, a third resistance R4 of 10 kΩ, a capacitor C1 with the capacitance of 1 nF, a load inductance L1 of 5 μH and a leakage inductance L2 of 200 nH. Unlike the simulation shown in FIG. 2 the simulation shown in FIG. 5 has been carried out for a first resistance R5 of 1 kΩ and with a fourth resistance R7 of 470Ω and a fifth resistance R6 of 2.2 kΩ.

Approximately 4 μs after the start of the simulation the driver signal U1 of the gate driver 7 is increased from a switch-off value of −8 V to a switch-on value of 20 V to switch on the semiconductor switch 3. As in the simulation shown in FIG. 2, the gate voltage U2 then rises and a reaction current I1 flowing through the gate resistor R1 is formed. As the gate voltage U2 increases the collector voltage U3 drops from 0.6 kV to virtually 0 V and a collector current I2 flowing between the collector and the emitter of the semiconductor switch 3 is formed, which rises linearly because of the load inductance L1.

The reaction current I1 initially increases in amount after the change in the driver signal U1 and then drops again as the gate voltage U2 increases. Approximately 5.5 μs after the start of the simulation the reaction current I1 changes its direction (or its sign), since the Miller capacitance of the semiconductor switch 3 charges up and the reaction current I1 flows back into the gate 5. As the collector current I2 increases the semiconductor switch 3 reaches its desaturation limit approximately 6 μs after the start of the simulation and the collector voltage U3 again starts to increase. Because of the Miller capacitance of the semiconductor switch 3 the gate voltage U2 rises above the switch-on value of 20 V of the driver signal U1 and the amount of the reaction current I1 flowing back into the gate 5 increases. Approximately 6.7 μs after the start of the simulation the thyristor structure formed by the PNP bipolar transistor Q3 and the NPN bipolar transistor Q4 is fired via the clamp diode D2. Thanks to the resistors R6, R7 added in comparison to the protective circuit 9 shown in FIG. 1, the semiconductor switch 3 is not however switched off after the firing of the bipolar transistors Q3, Q4, unlike in FIG. 2, but the gate voltage U2 is reduced to approximately 15 V, as a result of which the collector current I2 is reduced to a short-circuit current of approximately 160 A.

Figure 6:
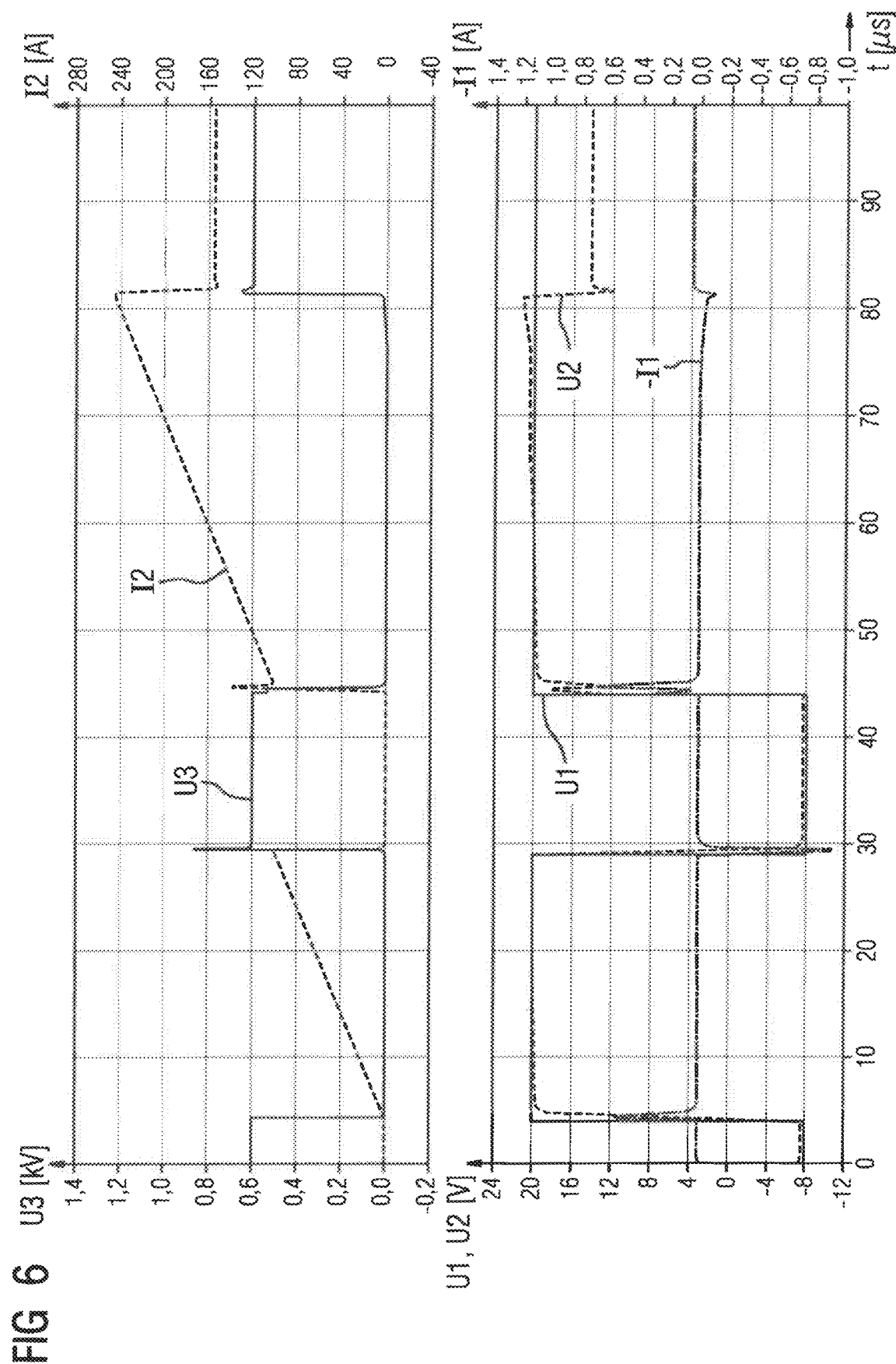

FIG. 6 shows progressions over time of the currents I1, I2 and voltages U1, U2, U3 of the circuit arrangement 1 shown in FIG. 4 during a simulation, which is analogous to the simulation shown in FIG. 3. The progressions have been generated with a simulation, in which, unlike in the simulation shown in FIG. 4, the load inductance L1 has the inductance value of 150 μH. Apart from this, the simulation is based on the same parameters as the simulation shown in FIG. 4.

The semiconductor switch 3 is switched on approximately 4 μs after the start of the simulation, in that the driver signal U1 of the gate driver 7 is increased from the switch-off value of −8 V to the switch-on value of 20 V, and is switched off again approximately 29 μs after the start of the simulation, in that the driver signal U1 is again reduced to the switch-off value of −8 V. During this first switch-on phase the gate voltage U2 rises only insignificantly above the switch-on value of 20 V, such that the thyristor structure formed by the PNP bipolar transistor Q3 and the NPN bipolar transistor Q4 does not fire.

Approximately 44 μs after the start of the simulation the semiconductor switch 3 is switched on a second time. In this second switch-on phase the collector current I2 rises rapidly after the switch-on to approximately the same value as at the end of the first switch-on phase, and the gate voltage U2 rises more significantly above the switch-on value of 20 V than in the first switch-on phase, as a result of which the reaction current I1 flows back into the gate 5 and the thyristor structure formed by the PNP bipolar transistor Q3 and the NPN bipolar transistor Q4 fires after approximately 81 μs. Analogously to FIG. 5, the gate voltage U2 drops after the firing of the bipolar transistors Q3, Q4 to approximately 15 V, as a result of which the collector current I2 is reduced to a short-circuit current of approximately 160 A.

FIGS. 5 and 6 show that the protective circuit 9 shown in FIG. 4 brings about reductions in the gate voltage U2 and in the collector current I2, if a desaturation of the semiconductor switch 3 is imminent. The reduced collector current I2 can then be switched off with a slower monitoring circuit, which for example comprises a current measurement with a potential isolation and an analog/digital conversion.

Figure 7:
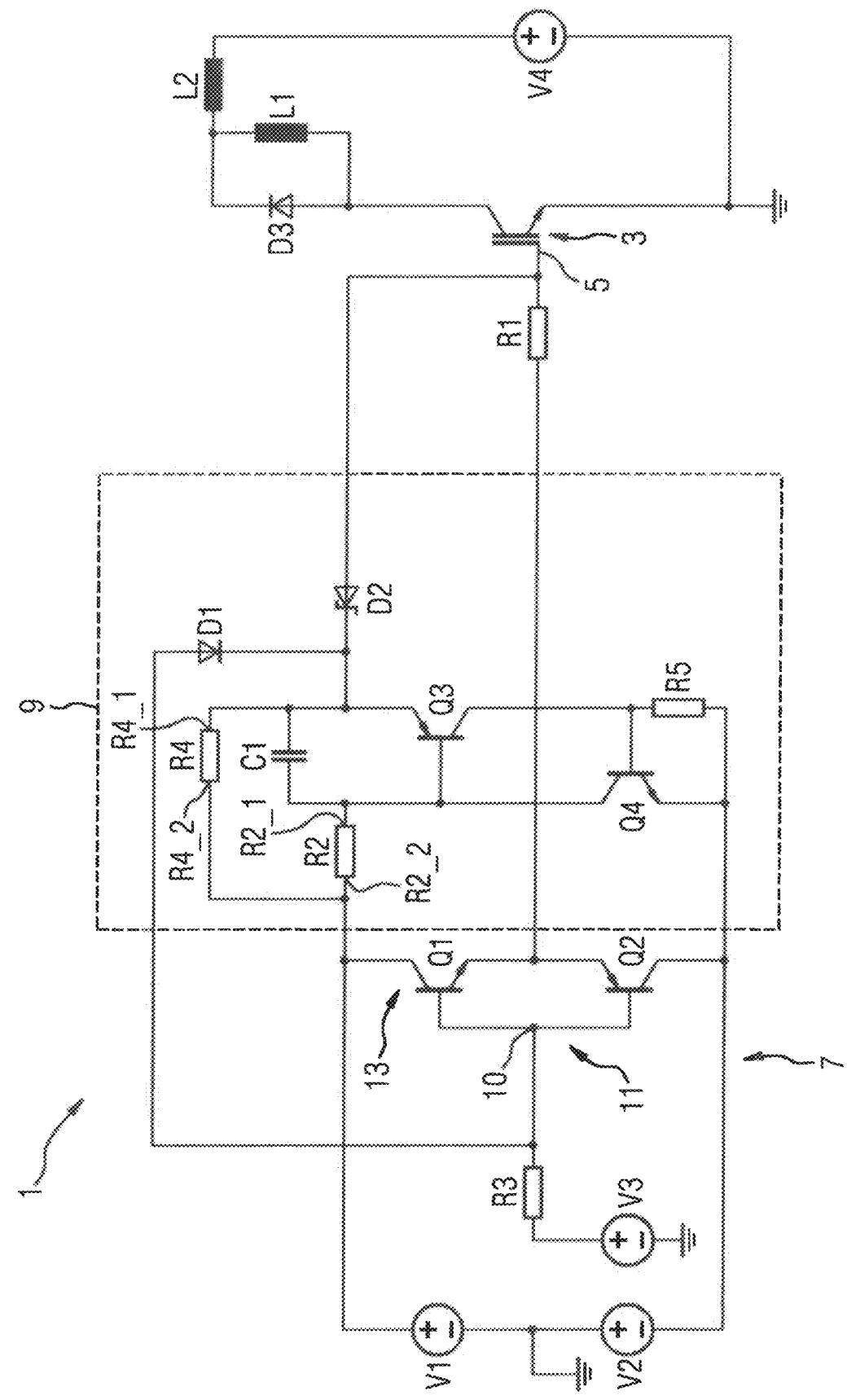

FIG. 7 shows a third exemplary embodiment of an inventive circuit arrangement 1. The circuit arrangement 1 differs from the circuit arrangement 1 shown in FIG. 1 only in that the third resistor R4 is not connected in parallel with the capacitor C1, but that a first terminal R4_1 of the third resistor R4 is connected to the emitter of the PNP bipolar transistor Q3 and the second terminal R4_2 of the third resistor R4 is connected to the second terminal R2_2 of the second resistor R2 and thus lies on the switch-on potential.

Figure 8:
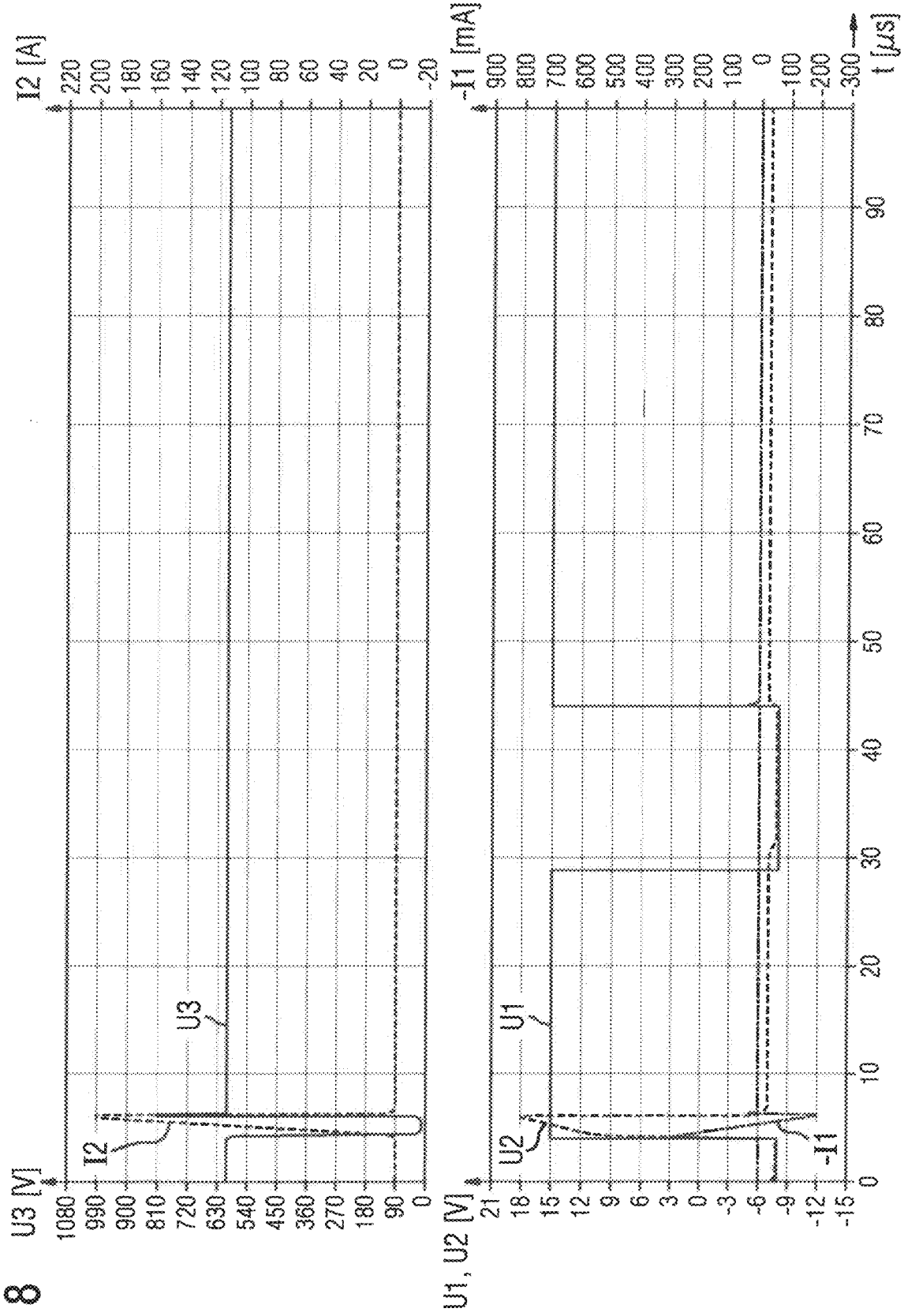
FIG. 8 shows progressions over time of currents and voltages of the circuit arrangement shown in FIG. 7, if the semiconductor switch reaches its desaturation limit after the switch-on, FIG. 9 shows a fourth exemplary embodiment of an inventive circuit arrangement.

FIG. 8 shows progressions over time of the currents I1, I2 and voltages U1, U2, U3 of the circuit arrangement 1 shown in FIG. 7 during a simulation, which is analogous to the simulation shown in FIG. 2. As in the simulation shown in FIG. 2, the simulation shown in FIG. 8 has been carried out for a gate resistance R1 of 10Ω, a driver resistance R3 of 470Ω, a first resistance R5 of 200Ω, a second resistance R2 of 1 kΩ, a load inductance L1 of 5 μH and a leakage inductance L2 of 200 nH. Unlike in the simulation shown in FIG. 2, the simulation shown in FIG. 8 has been carried out for a third resistance R4 of 2.2 kΩ and a capacitor C1 with a capacitance of 2 nF.

Approximately 4 μs after the start of the simulation the driver signal U1 of the gate driver 7 is increased from a switch-off value of −8 V to a switch-on value of 15 V to switch on the semiconductor switch 3. As in the simulation shown in FIG. 2, the gate voltage U2 then increases and a reaction current I1 flowing through the gate resistor R1 is formed. As the gate voltage U2 increases, the collector voltage U3 drops from 0.6 kV to virtually 0 V and a collector current I2 flowing between the collector and the emitter of the semiconductor switch 3 is formed, which increases linearly because of the load inductance L1.

The reaction current I1 initially increases in amount after the change in the driver signal U1 and then drops again as the gate voltage U2 increases. Approximately 5.5 μs after the start of the simulation the reaction current I1 changes its direction (or its sign), since the Miller capacitance of the semiconductor switch 3 charges up and the reaction current I1 flows back into the gate 5. Approximately 5.8 μs after the start of the simulation the semiconductor switch 3 reaches its desaturation limit. Because of the Miller capacitance of the semiconductor switch 3 the gate voltage U2 rises above the switch-on value of 15 V of the driver signal U1 and the amount of the reaction current I1 flowing back into the gate 5 increases. Approximately 6 μs after the start of the simulation the thyristor structure formed by the PNP bipolar transistor Q3 and the NPN bipolar transistor Q4 fires via the clamp diode D2, the gate voltage U2 drops to the negative switch-off gate voltage value and the semiconductor switch 3 is switched off. The third resistor R4 provides for a permanent holding current for the bipolar transistors Q3, Q4 of the protective circuit 9, such that the gate voltage U2 remains negative even if the driver signal U1 is set to the switch-off value of −8 V and then again to the switch-on value of 15 V.

FIG. 8 shows that the protective circuit 9 shown in FIG. 7 brings about a permanent switch-off of the semiconductor switch 3 by firing the bipolar transistors Q3, Q4 of the protective circuit 9, if the semiconductor switch 3 reaches its desaturation limit.

Figure 9:
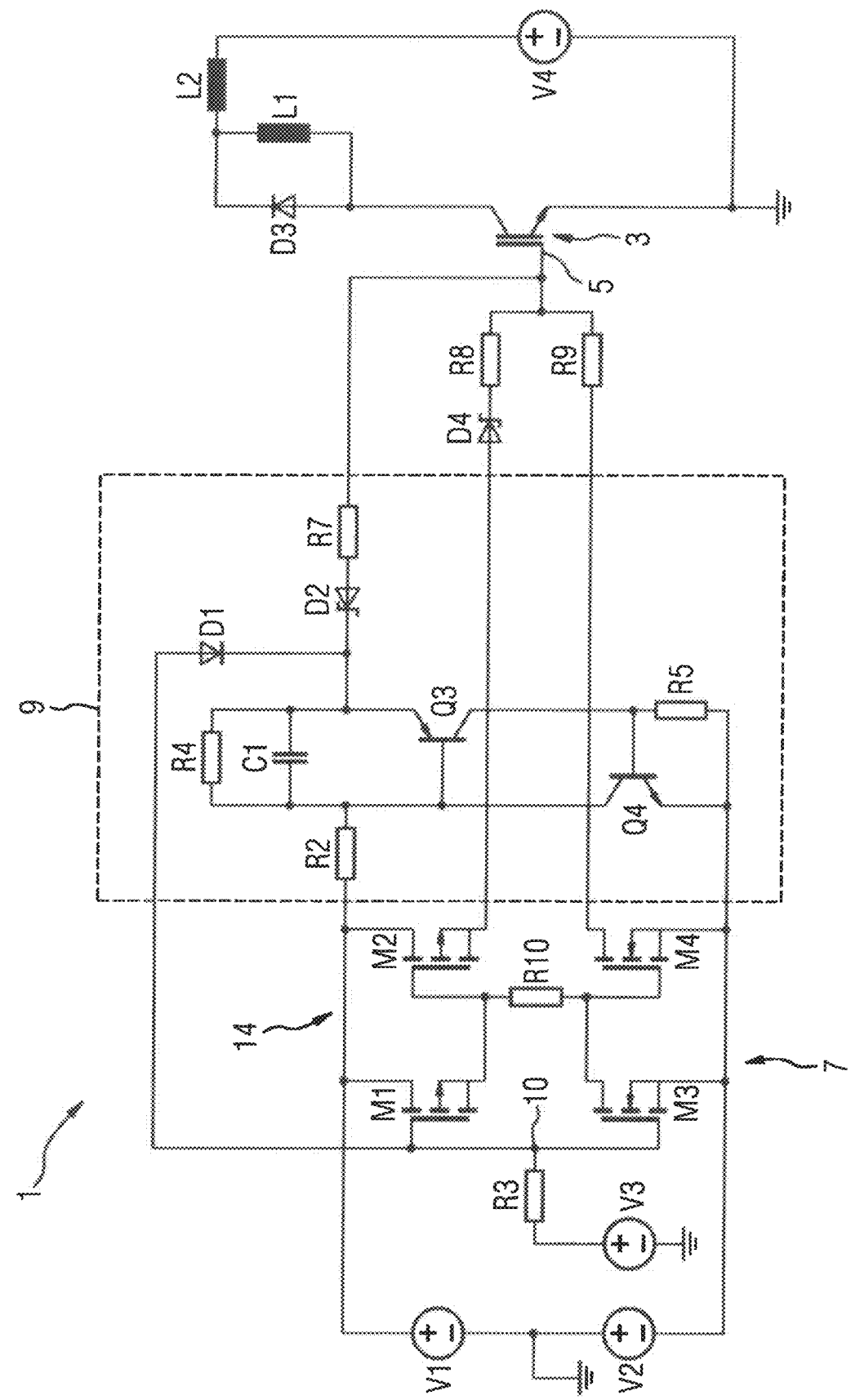

FIG. 9 shows a fourth exemplary embodiment of an inventive circuit arrangement 1. The circuit arrangement 1 differs from the circuit arrangement 1 shown in FIG. 1 firstly by a fourth resistor R7, which is connected between the anode of the damp diode D2 and the gate 5 of the semiconductor switch 3, and secondly by the implementation of the electronic switching unit 11 and its connection to the gate 5.

The electronic switching unit 11 has a power amplifier 14 with complementary power amplifier MOSFETs M1 to M4 instead of a push-pull power amplifier 13 with power amplifier bipolar transistors Q1, Q2. A first power amplifier MOSFET M1 and a second power amplifier MOSFET M2 of the power amplifier 14 are each configured as a p-channel MOSFET. A third power amplifier MOSFET M3 and a fourth power amplifier MOSFET M4 of the power amplifier 14 are each configured as an n-channel MOSFET. The gate terminals of the first power amplifier MOSFET M1 and of the third power amplifier MOSFET M3 are connected to the control input 10 of the electronic switching unit 11. The drain terminal of the first power amplifier MOSFET M1 is connected to the gate terminal of the second power amplifier MOSFET M2. The drain terminal of the third power amplifier MOSFET M3 is connected to the gate terminal of the fourth power amplifier MOSFET M4. The source terminals of the first power amplifier MOSFET M1 and of the second power amplifier MOSFET M2 lie on the switch-on potential, i.e. these source terminals are connected to the positive terminal of the switch-on voltage source V1. The source terminals of the third power amplifier MOSFET M3 and of the fourth power amplifier MOSFET M4 lie on the switch-off potential, i.e. these source terminals are connected to the negative terminal of the switch-off voltage source V2. The drain terminal of the second power amplifier MOSFET M2 is connected to the gate 5 of the semiconductor switch 3 via a ballast diode D4 and a switch-on gate resistor R8, wherein the anode of the ballast diode D4 is connected to the drain terminal of the second power amplifier MOSFET M2 and the switch-on gate resistor R8 is connected between the cathode of the ballast diode D4 and the gate 5. The drain terminal of the fourth power amplifier MOSFET M4 is connected to the gate 5 of the semiconductor switch 3 via a switch-off gate resistor R9. The drain terminals of the first power amplifier MOSFET M1 and of the third power amplifier MOSFET M3 are connected to one another via a connection resistor R10.

Figure 10:
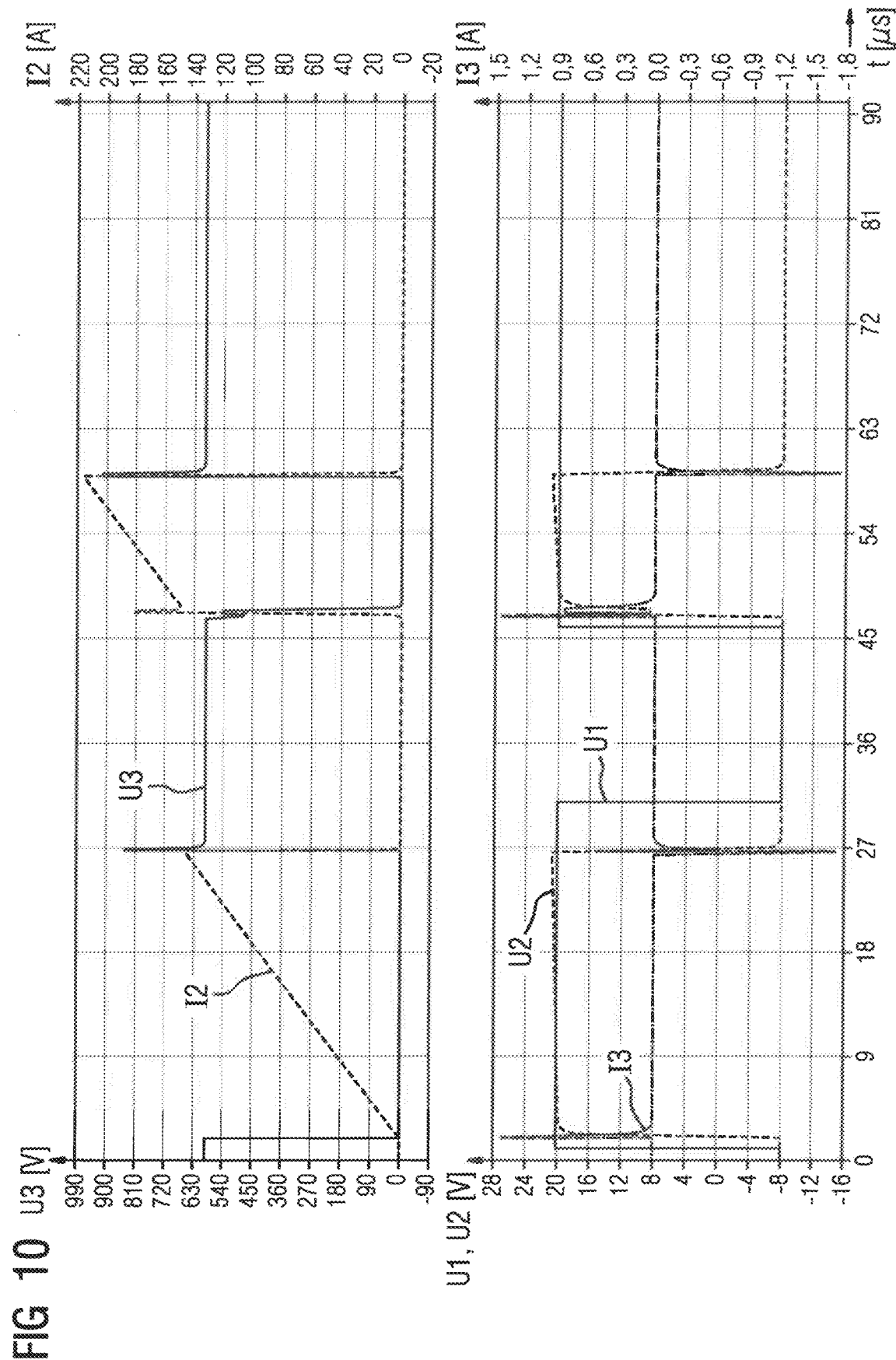
FIG. 10 shows progressions over time of currents and voltages of the circuit arrangement shown in FIG. 9, if the semiconductor switch reaches its desaturation limit at each of two successive switch-on phases.

FIG. 10 shows progressions over time of the collector current I2, of a gate current I3 through the gate 5 and of the voltages U1, U2, U3 of the circuit arrangement 1 shown in FIG. 9 during a simulation for a switch-on gate resistance R8 and a switch-off gate resistance R9 of 10Ω in each case, a driver resistance R3 of 470Ω, a first resistance R5 of 1 kΩ, a second resistance R2 of 470Ω, a third resistance R4 of 10 kΩ, a fourth resistance R7 of 100Ω, a connection resistance R10 of 50Ω, a capacitor C1 with a capacitance of 2 nF, a load inductance L1 of 100 μH and a leakage inductance L2 of 200 nH.

Approximately 1 μs after the start of the simulation the driver signal U1 of the gate driver 7 is increased from a switch-off value of −8 V to a switch-on value of 20 V to switch on the semiconductor switch 3. Analogously to the simulation shown in FIG. 2, the gate voltage U2 then increases until it exceeds the switch-on value of 20 V significantly enough that the thyristor structure formed by the PNP bipolar transistor Q3 and the NPN bipolar transistor Q4 of the protective circuit 9 fires, the gate voltage U2 again drops to the switch-off gate voltage value of approximately −8 V and the semiconductor switch 3 is switched off. Approximately 31 μs after the start of the simulation the driver signal U1 is reset to the switch-off value of −8 V and approximately 46 μs after the start of the simulation increases again to the switch-on value of 20 V. Approximately 59 μs after the start of the simulation the gate voltage U2 once again exceeds the switch-on value of 20 V significantly enough that the thyristor structure formed by the PNP bipolar transistor Q3 and the NPN bipolar transistor Q4 of the protective circuit 9 fires and the semiconductor switch 3 is once again switched off. Unlike in the simulation shown in FIG. 8, the gate voltage U2 does not remain negative ("does not engage") during the simulation shown in FIG. 10 after the second increase in the driver signal U1 to the switch-on value of 20 V, but increases again, because the fourth resistor R4 is not connected as in FIG. 7 but in accordance with FIG. 9.

FIG. 10 shows that the protective circuit 9 shown in FIG. 9 brings about a temporary switch-off of the semiconductor switch 3 for a switching cycle of the gate driver 7 thanks to the firing of the bipolar transistors Q3, Q4 of the protective circuit 9, if the semiconductor switch 3 reaches its saturation limit during the switching cycle. FIG. 10 further shows that an inventive protective circuit 9 also works in conjunction with a gate driver 7 which has a power amplifier 14 with complementary power amplifier MOSFETs M1 to M4 instead of a push-pull power amplifier 13 with power amplifier bipolar transistors Q1, Q2.

The exemplary embodiments described on the basis of FIGS. 1 to 8 can, analogously to the exemplary embodiment described on the basis of FIGS. 9 and 10, likewise be implemented with a gate driver 7 which has a power amplifier 14 with complementary power amplifier MOSFETs M1 to M4 instead of a push-pull power amplifier 13 with power amplifier bipolar transistors Q1, Q2. The exemplary embodiments shown in FIGS. 1 to 10 can be further modified, in that instead of an IGBT a MOSFET is used as a semiconductor switch 3.

Although the invention as been illustrated and described in detail more fully using preferred exemplary embodiments, the invention is not restricted by the disclosed examples and other variations can be derived therefrom by the person skilled in the art, without departing from the scope of protection of the invention.

The invention claimed is:

1. A protective circuit for a semiconductor switch, with the semiconductor switch having a gate controllable by a gate driver and connected to the gate in parallel with the gate driver, the protective circuit comprising:
   a clamp diode,
   a PNP bipolar transistor, comprising an emitter connected to a cathode of the clamp diode
   an NPN bipolar transistor comprising a collector connected to a base of the PNP bipolar transistor and a base connected to a collector of the PNP bipolar transistor,
   a first resistor connected in parallel with the base-emitter path of the NPN bipolar transistor,
   a second resistor comprising a first terminal connected to the base of the PNP bipolar transistor,
   a capacitor connected in parallel with a base-emitter path of the PNP bipolar transistor, and
   a third resistor connected either in parallel with the capacitor or with a first terminal of the third resistor connected to the emitter of the PNP bipolar transistor and a second terminal connected to a second terminal of the second resistor.

2. The protective circuit of claim 1, further comprising a fourth resistor connected to an anode of the clamp diode.

3. The protective circuit of claim 1, further comprising a fifth resistor and an additional diode, with a cathode of the additional diode connected to the emitter of the PNP bipolar transistor and the cathode of the clamp diode either directly or via the fifth resistor.

4. The protective circuit of claim 1, wherein the damp diode is a Schottky diode.

5. A circuit arrangement, comprising
   a semiconductor switch having a gate,
   a gate driver controlling the gate, the gate driver comprising
      an electronic switching unit controllable by a driver voltage of the gate driver,
      a switch-on gate resistor connecting the gate to a switch-on potential to switch on the semiconductor switch, and
      a switch-off gate resistor connecting the gate to a switch-off potential to switch off the semiconductor switch, and
   a protective circuit connected to the gate in parallel with the gate driver,
   the protective circuit comprising
      a damp diode;
      a PNP bipolar transistor, comprising an emitter connected to a cathode of the damp diode
      an NPN bipolar transistor comprising a collector connected to a base of the PNP bipolar transistor and a base connected to a collector of the PNP bipolar transistor,
      a first resistor connected in parallel with the base-emitter path of the NPN bipolar transistor,
      a second resistor comprising a first terminal connected to the base of the PNP bipolar transistor,
      a capacitor connected in parallel with a base-emitter path of the PNP bipolar transistor, and
      a third resistor connected either in parallel with the capacitor or with a first terminal of the third resistor connected to the emitter of the PNP bipolar transistor and a second terminal connected to a second terminal of the second resistor.

6. The circuit arrangement of claim 5, wherein the emitter of the NPN bipolar transistor is connected to the switch-off potential and the second terminal of the second resistor is connected to the switch-on potential.

7. The circuit arrangement of claim 5, further comprising a fourth resistor connecting the gate to an anode of the clamp diode.

8. The circuit arrangement of claim 5, further comprising an additional diode having a cathode connected to the emitter of the PNP bipolar transistor and the cathode of the damp diode, with the driver voltage being applied to an anode of the additional diode.

9. The circuit arrangement of claim 7, further comprising an additional diode having a cathode connected via a fifth resistor to the emitter of the PNP bipolar transistor and to the cathode of the damp diode, with the driver voltage being applied to an anode of the additional diode.

10. The circuit arrangement of claim 5, wherein the switch-on gate resistor and the switch-off gate resistor are identical.

11. The circuit arrangement of claim 5, further comprising a ballast diode connected between the switch-on gate resistor and the gate driver, with a cathode of the ballast diode connected to the switch-on gate resistor.

12. The circuit arrangement of claim 5, wherein the semiconductor switch is a bipolar transistor with an insulated gate electrode or a metal-oxide semiconductor field-effect transistor.

13. The circuit arrangement of claim 5, wherein the electronic switching unit comprises a push-pull power amplifier with power amplifier bipolar transistors.

14. The circuit arrangement of claim 5, wherein the electronic switching unit comprises a power amplifier with complementary power amplifier metal-oxide semiconductor field-effect transistors.

15. A circuit arrangement, comprising:
   a semiconductor switch having a gate,
   a gate driver the gate, the gate driver comprising
      an electronic switching unit controllable by a driver voltage of the gate driver, a switch-on gate resistor connecting the gate to a switch-on potential to switch on the semiconductor switch, and
  a switch-off gate resistor connecting the gate to a switch-off potential to switch off the semiconductor switch, and
a protective circuit connected to the gate in parallel with the gate driver,
the protective circuit comprising
  a clamp diode having an anode connected to the gate,
  a PNP bipolar transistor, comprising an emitter connected to a cathode of the clamp diode
  a NPN bipolar transistor comprising a collector connected to a base of the PNP bipolar transistor and a base connected to a collector of the PNP bipolar transistor,
  a first resistor connected in parallel with the base-emitter path of the NPN bipolar transistor,
  a second resistor comprising a first terminal connected to the base of the PNP bipolar transistor,
  a capacitor connected in parallel with a base-emitter path of the PNP bipolar transistor, and
  a third resistor connected either in parallel with the base-emitter path of the PNP bipolar transistor or with a first terminal of the third resistor connected to the emitter of the PNP bipolar transistor and a second terminal connected to a second terminal of the second resistor.

* * * * *